US010998774B2

(12) United States Patent
Wong et al.

(10) Patent No.: US 10,998,774 B2
(45) Date of Patent: May 4, 2021

(54) WIRELESS DOCKING MAT FOR ELECTRONIC DEVICES

(71) Applicant: INTEL CORPORATION, Santa Clara, CA (US)

(72) Inventors: Hong W. Wong, Portland, OR (US);
Timothy Nguyen, Portland, OR (US);
Shaorong Zhou, Shanghai (CN);
Xiaoguo Liang, Shanghai (CN);
Chia-Hung Kuo, Folsom, CA (US)

(73) Assignee: INTEL CORPORATION, Santa Clara, CA (US)

( * ) Notice: Subject to any disclaimer, the term of this patent is extended or adjusted under 35 U.S.C. 154(b) by 142 days.

(21) Appl. No.: 16/085,942

(22) PCT Filed: Jul. 21, 2016

(86) PCT No.: PCT/CN2016/090837
§ 371 (c)(1),
(2) Date: Sep. 17, 2018

(87) PCT Pub. No.: WO2018/014284
PCT Pub. Date: Jan. 25, 2018

(65) Prior Publication Data
US 2020/0303967 A1 Sep. 24, 2020

(51) Int. Cl.
H02J 50/80 (2016.01)
H02J 50/90 (2016.01)
(Continued)

(52) U.S. Cl.
CPC .............. H02J 50/80 (2016.02); H01F 38/14 (2013.01); H02J 7/00034 (2020.01); H02J 7/02 (2013.01);
(Continued)

(58) Field of Classification Search
CPC .. H02J 50/80; H02J 50/90; H02J 50/05; H02J 7/02; H02J 7/00034; H02J 50/10; H05K 7/20136; H01F 38/14
See application file for complete search history.

(56) References Cited

U.S. PATENT DOCUMENTS

2012/0235637 A1* 9/2012 Tanabe .................. H02J 50/10
320/108
2013/0093388 A1 4/2013 Partovi
(Continued)

FOREIGN PATENT DOCUMENTS

CN 101572423 A 11/2009
CN 204144989 2/2015
(Continued)

OTHER PUBLICATIONS

International Search Report and Written Opinion for PCT Application No. PCT/CN2016/090837, 12 pages, dated Apr. 5, 2017.

Primary Examiner — Daniel J Cavallari
Assistant Examiner — Brian K Baxter
(74) Attorney, Agent, or Firm — Jaffery Watson Mendonsa & Hamilton LLP

(57) ABSTRACT

In one example a docking mat for an electronic device comprises a first major surface on which the electronic device may be positioned, a wireless power transmitting device, and a controller comprising logic, at least partly including hardware logic, to determine a location of the electronic device on the first major surface of the docking mat, establish a communication connection with the electronic device, receive at least one charge parameter from the electronic device, and activate the wireless power transmitting device in response to a determination that the electronic device is positioned proximate the wireless power transmitting device and the at least one charge parameter indicates
(Continued)

that the electronic device is in a condition to receive power from the wireless power transmitting device. Other examples may be described.

17 Claims, 12 Drawing Sheets

(51) Int. Cl.
  *H02J 50/05* (2016.01)
  *H02J 50/10* (2016.01)
  *H02J 7/00* (2006.01)
  *H01F 38/14* (2006.01)
  *H02J 7/02* (2016.01)
  *H05K 7/20* (2006.01)

(52) U.S. Cl.
  CPC .............. *H02J 50/05* (2016.02); *H02J 50/10* (2016.02); *H02J 50/90* (2016.02); *H05K 7/20136* (2013.01)

(56) References Cited

U.S. PATENT DOCUMENTS

| | | | |
|---|---|---|---|
| 2013/0328411 A1 | 12/2013 | Tanabe | |
| 2014/0191717 A1* | 7/2014 | Hong | H02J 50/90 320/108 |
| 2014/0300317 A1* | 10/2014 | Kim | H02J 7/007 320/108 |
| 2016/0020633 A1* | 1/2016 | Han | H02J 50/80 320/108 |

FOREIGN PATENT DOCUMENTS

| | | |
|---|---|---|
| CN | 104981965 A | 10/2015 |
| CN | 109417307 A | 3/2019 |
| JP | 5713874 B2 | 5/2015 |
| WO | 2015088108 A1 | 6/2015 |

* cited by examiner

FIG. 1  ELECTRONIC DEVICE 100

WIRELESS DOCKING MAT FOR ELECTRONIC DEVICES

This application claims the benefit of priority under 35 U.S.C. § 371 to International Application No. PCT/CN2016/090837 filed Jul. 21, 2016, entitled WIRELESS DOCKING MAT FOR ELECTRONIC DEVICES, the disclosure of which is incorporated herein by reference in its entirety.

BACKGROUND

The subject matter described herein relates generally to the field of electronic devices and more particularly to a wireless docking mat for electronic devices.

Wireless charging platforms for electronic devices typically incorporate a wireless power transmitting device which may be coupled, either by inductance or by capacitance, to a wireless power receiving device in an electronic device. Efficient coupling between wireless power transmitting device and the wireless power receiving device is useful to support efficient wireless charging. Accordingly, wireless docking mats for electronic devices may find utility.

BRIEF DESCRIPTION OF THE DRAWINGS

The detailed description is described with reference to the accompanying figures.

DETAILED DESCRIPTION

Described herein are exemplary systems and methods to implement a wireless docking mat in electronic devices. In the following description, numerous specific details are set forth to provide a thorough understanding of various examples. However, it will be understood by those skilled in the art that the various examples may be practiced without the specific details. In other instances, well-known methods, procedures, components, and circuits have not been illustrated or described in detail so as not to obscure the particular examples.

As described above, it may be useful to provide wireless charging systems for electronic device(s). In some examples the subject matter described herein addresses these and other issues by providing a docking mat for an electronic device which comprises a first major surface on which the electronic device may be positioned and a wireless power transmitting device within the docking mat. In some examples the docking mat may further comprise a controller comprising logic, at least partly including hardware logic, to determine a location of the electronic device on the first major surface of the docking mat, establish a communication connection with the electronic device, receive at least one charge parameter from the electronic device, and activate the wireless power transmitting device in response to a determination that the electronic device is positioned proximate the wireless power transmitting device and the at least one charge parameter indicates that the electronic device is in a condition to receive power from the wireless power transmitting device.

Similarly, in some examples the electronic device comprises a wireless power receiving device, and at least one sensor to detect the wireless power transmitting device to receive power from the wireless power transmitting device in the charging mat.

Additional features and operating characteristics of the electronic device and associated system are described below with reference to FIGS. 1-10.

Figure 1:
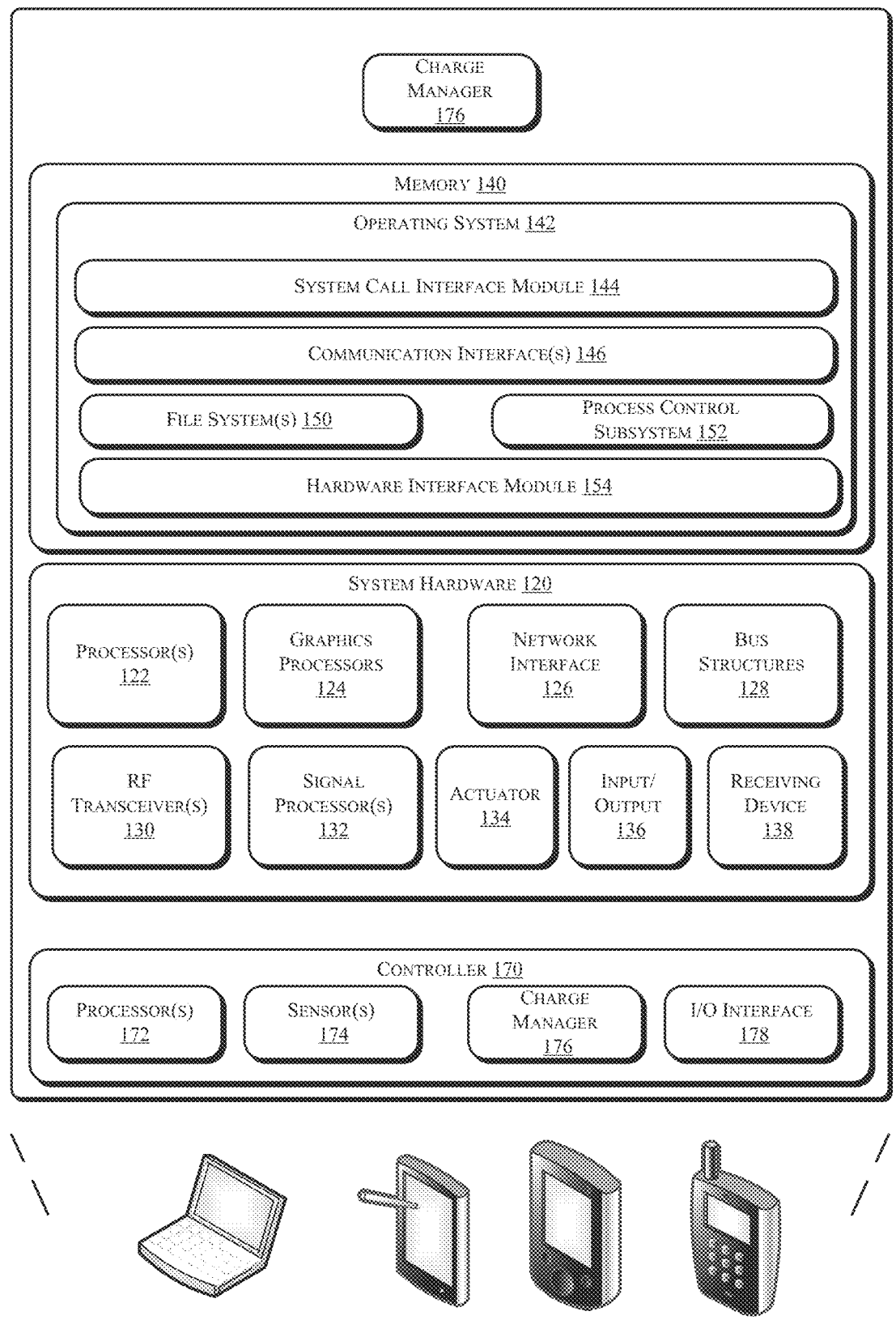
FIG. 1 is a schematic illustration of an electronic device which may be adapted to implement wireless docking mats in accordance with some examples.

FIG. 1 is a schematic illustration of an electronic device 100 which may be adapted to include one or more wireless docking mats in accordance with some examples. In various examples, electronic device 100 may include or be coupled to one or more accompanying input/output devices including a display, one or more speakers, a keyboard, one or more other I/O device(s), a mouse, a camera, or the like. Other exemplary I/O device(s) may include a touch screen, a voice-activated input device, a track ball, a geolocation device, an accelerometer/gyroscope, biometric feature input devices, and any other device that allows the electronic device 100 to receive input from a user.

The electronic device 100 includes system hardware 120 and memory 140, which may be implemented as random access memory and/or read-only memory. A file store may be communicatively coupled to electronic device 100. The file store may be internal to electronic device 100 such as, e.g., eMMC, SSD, one or more hard drives, or other types of storage devices. Alternatively, the file store may also be external to electronic device 100 such as, e.g., one or more external hard drives, network attached storage, or a separate storage network.

System hardware 120 may include one or more processors 122, graphics processors 124, network interfaces 126, and bus structures 128. In one embodiment, processor 122 may be embodied as an Intel® Atom™ processors, Intel® Atom™ based System-on-a-Chip (SOC) or Intel® Core2 Duo® or i3/i5/i7 series processor available from Intel Corporation, Santa Clara, Calif., USA. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit.

Graphics processor(s) 124 may function as adjunct processor that manages graphics and/or video operations. Graphics processor(s) 124 may be integrated onto the motherboard of electronic device 100 or may be coupled via an expansion slot on the motherboard or may be located on the same die or same package as the Processing Unit.

In one embodiment, network interface 126 could be a wired interface such as an Ethernet interface (see, e.g., Institute of Electrical and Electronics Engineers/IEEE 802.3-2002) or a wireless interface such as an IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a general packet radio service (GPRS) interface (see, e.g., Guidelines on GPRS Handset Requirements, Global System for Mobile Communications/GSM Association, Ver. 3.0.1, December 2002).

Bus structures 128 connect various components of system hardware 128. In one embodiment, bus structures 128 may be one or more of several types of bus structure(s) including a memory bus, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI), a High Speed Synchronous Serial Interface (HSI), a Serial Low-power Inter-chip Media Bus (SLIMbus®), or the like.

Electronic device 100 may include an RF transceiver 130 to transceive RF signals, and a signal processing module 132 to process signals received by RF transceiver 130. RF transceiver may implement a local wireless connection via a protocol such as, e.g., Bluetooth or 802.11X. IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a WCDMA, LTE, general packet radio service (GPRS) interface (see, e.g., Guidelines on GPRS Handset Requirements, Global System for Mobile Communications/GSM Association, Ver. 3.0.1, December 2002).

Electronic device 100 may further include one or more power storage devices 134, e.g., batteries, and one or more input/output interfaces 136 such as, e.g., a keypad and/or a display. In some examples electronic device 100 may not have a keypad and use the touch panel for input.

Electronic device 100 may further include at least one wireless power receiving device 138 to receive power via an electromagnetic coupling with a driven coil in a charging device. The wireless power receiving device 138 may comprise one or more coil(s) to receive power through an inductive coupling with a driven coil or coupling charge plate(s) to receive power through a capacitive coupling with a driven capacitor in the charging device.

Memory 140 may include an operating system 142 for managing operations of electronic device 100. In one embodiment, operating system 142 includes a hardware interface module 154 that provides an interface to system hardware 120. In addition, operating system 140 may include a file system 150 that manages files used in the operation of electronic device 100 and a process control subsystem 152 that manages processes executing on electronic device 100.

Operating system 142 may include (or manage) one or more communication interfaces 146 that may operate in conjunction with system hardware 120 to send and/or receive data packets and/or data streams from a remote source. Operating system 142 may further include a system call interface module 144 that provides an interface between the operating system 142 and one or more application modules resident in memory 140. Operating system 142 may be embodied as a UNIX operating system or any derivative thereof (e.g., Linux, Android, etc.) or as a Windows® brand operating system, or other operating systems.

In some examples an electronic device may include a controller 170, which may comprise one or more controllers that are separate from the primary execution environment. The separation may be physical in the sense that the controller may be implemented in controllers which are physically separate from the main processors. Alternatively, the trusted execution environment may logical in the sense that the controller may be hosted on same chip or chipset that hosts the main processors.

By way of example, in some examples the controller 170 may be implemented as an independent integrated circuit located on the motherboard of the electronic device 100, e.g., as a dedicated processor block on the same SOC die. In other examples the trusted execution engine may be implemented on a portion of the processor(s) 122 that is segregated from the rest of the processor(s) using hardware enforced mechanisms In the embodiment depicted in FIG. 1 the controller 170 comprises a processor 172, a sensor 174, a charge manager 176, and an I/O interface 178. In some examples sensor(s) 174 may include a wireless communication capability to detect the presence of electronic device 100. Alternatively, sensor(s) 174 may comprise one or more of an optical sensor which detects the presence of electronic device 100 or a pressure sensor to detect the positioning of electronic device 100 on charger 200. The I/O module 178 may comprise a serial I/O module or a parallel I/O module. Because the controller 170 is separate from the main processor(s) 122 and operating system 142, the controller 170 may be made secure, i.e., inaccessible to hackers who typically mount software attacks from the host processor 122. In some examples portions of the charge manager 176 may reside in the memory 140 of electronic device 100 and may be executable on one or more of the processors 122.

Figure 2:
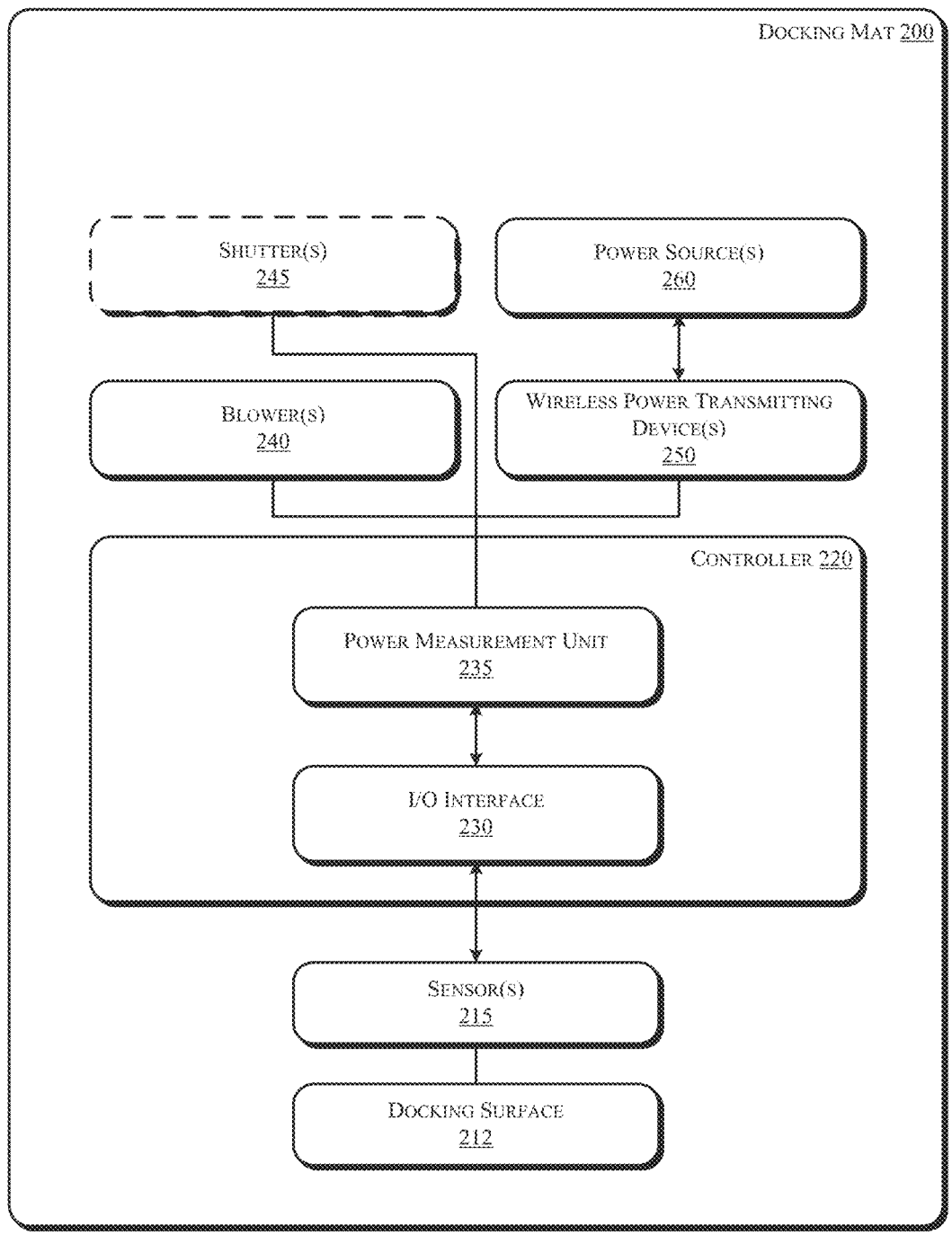
FIG. 2 is a high-level schematic illustration of a wireless docking mat adapted for use with an electronic device in accordance with some examples.

In some examples the charge manager 176 interacts with one or more other components of the electronic device 100 to manage wireless charger coupling between electronic device 100 and a wireless charging device. FIG. 2 is a high-level schematic illustration of components of a wireless docking mat adapted to implement wireless charger coupling with an electronic device in accordance with some examples. Referring to FIG. 2, docking mat 200 includes a docking surface 212 and one or more sensors 215 to detect the presence of an electronic device such as electronic device 100 in proximity to docking mat 200. In some examples sensor(s) 210 may include a wireless communication capability to detect the presence of electronic device 100. Alternatively, sensor(s) 210 may comprise one or more of an optical sensor which detects the presence of electronic device 100 or a pressure sensor to detect the positioning of electronic device 100 on charger 200.

Charger 200 further comprises a controller 220, which may be embodied as general purpose processor or as a low-power controller similar to the such as controller 170 described with reference to FIG. 1. Controller 220 may comprise an input/output (I/O) interface 230, which may be implemented as a wireless communication interface as described above or a wired communication interface. Charger 200 further comprises a power measurement unit 235, which may be implemented as logic instructions executable on controller 220, e.g., as software or firmware, or may be reduced to hardwired logic circuits, or combinations thereof.

Power measurement unit 235 of controller 220 may be communicatively coupled to one or more wireless charging device(s) 250, e.g., a charging coil or charging plate, which in turn may be coupled to one or more power sources 260. Further, power measurement unit 235 of controller 220 may be communicatively coupled to one or more blowers 240 and/or, one or more shutters 245, as described in greater detail below.

Figure 3A:
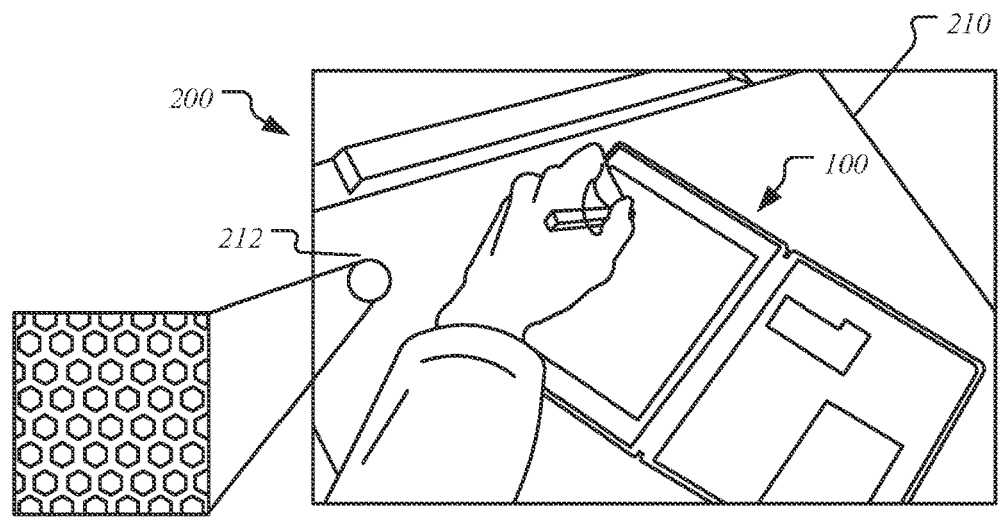
FIGS. 3A, 3B, and 3C are schematic views of a wireless docking mat adapted for use with an electronic device in accordance with some examples.
Figure 3B:
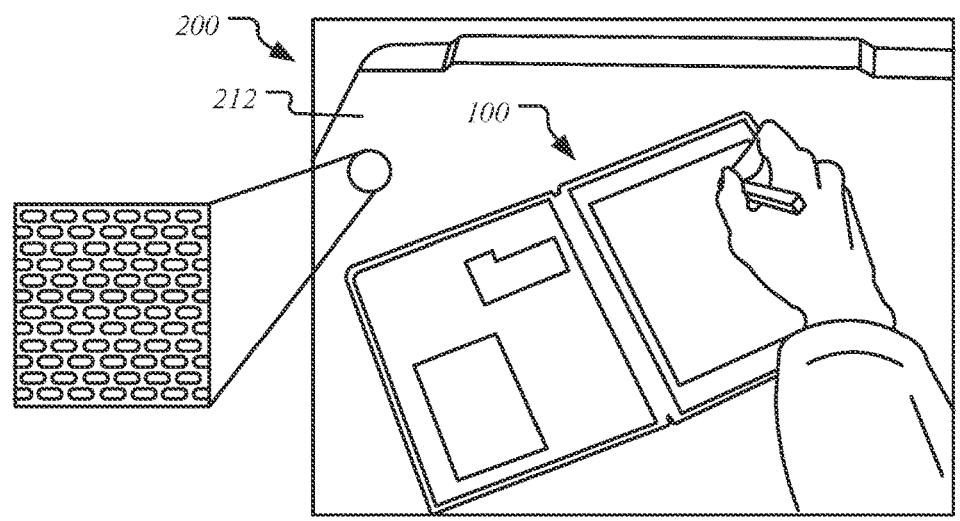
Figure 3C:
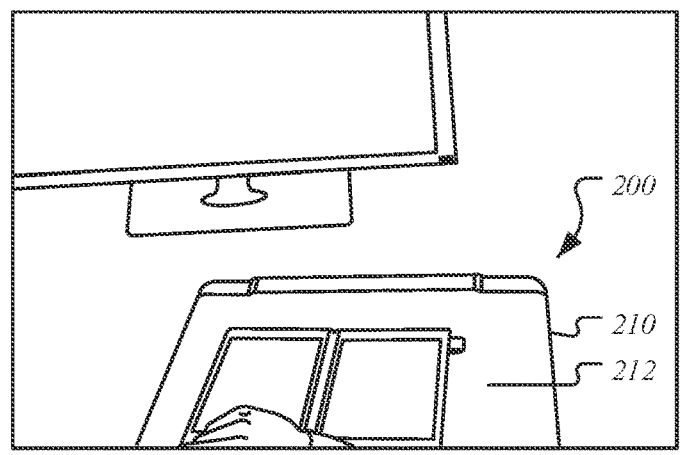

Examples of a wireless docking mat will be described with reference to FIGS. 3A-3E and FIG. 4. In some examples a wireless docking mat 200 comprises a body 210 having a first major surface 212 on which an electronic device 100 may be positioned. As illustrated in FIGS. 3A-3C, the first major surface 212 may be dimensioned such that an electronic device 100 may be positioned on the first major surface in multiple different orientations. FIG. 3A depicts the electronic device 100 in an orientation that is useful for writing for left-handed users. FIG. 3B depicts the electronic device 100 in an orientation that is useful for writing for right-handed users. FIG. 3C depicts the electronic device in an orientation that is useful for reading. Further, in some examples the first major surface 212 may comprise a surface pattern as illustrated in FIGS. 3A and 3B which provides a slight gap between portions of the first major surface 212 and the electronic device 100 to allow airflow there between.

Figure 3D:
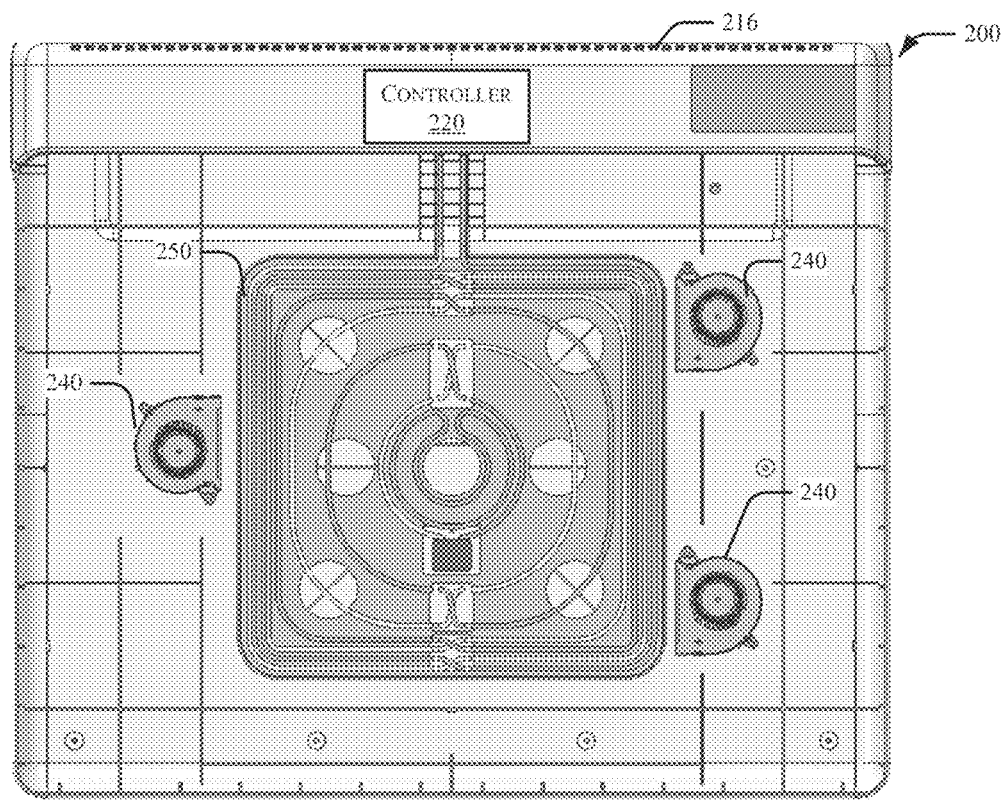
FIGS. 3D and 3E are schematic views of components of a wireless docking mat adapted for use with an electronic device in accordance with some examples.
Figure 3E:
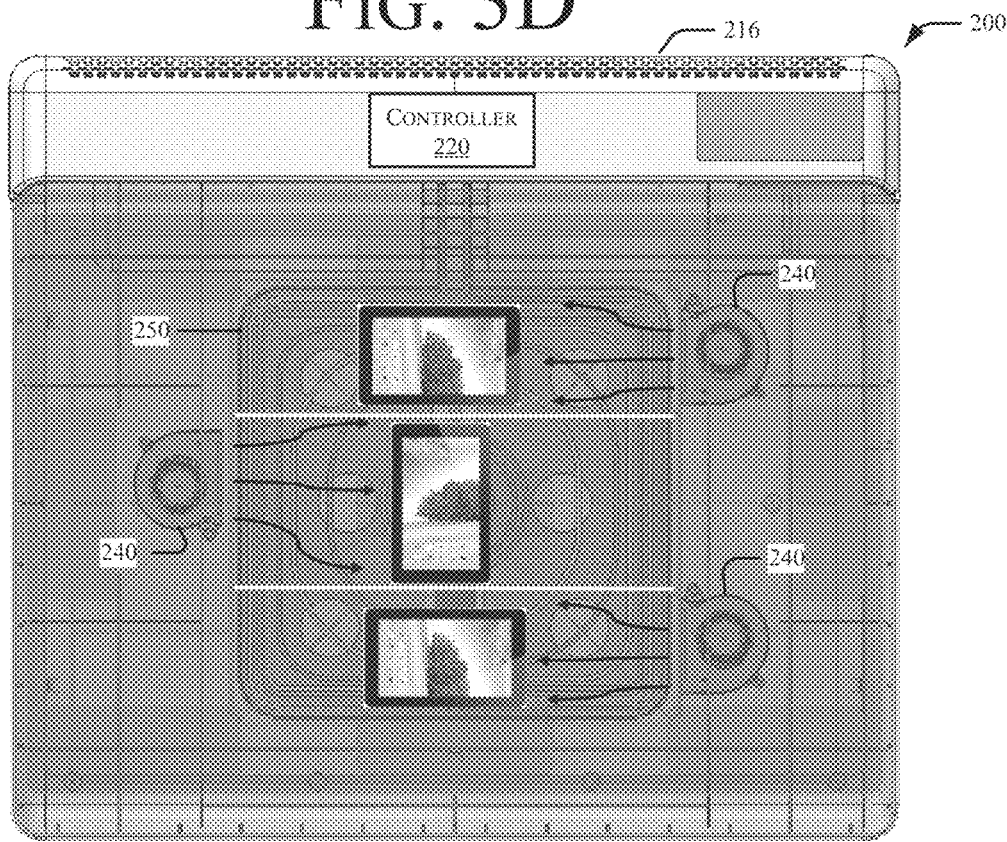
Figure 4:
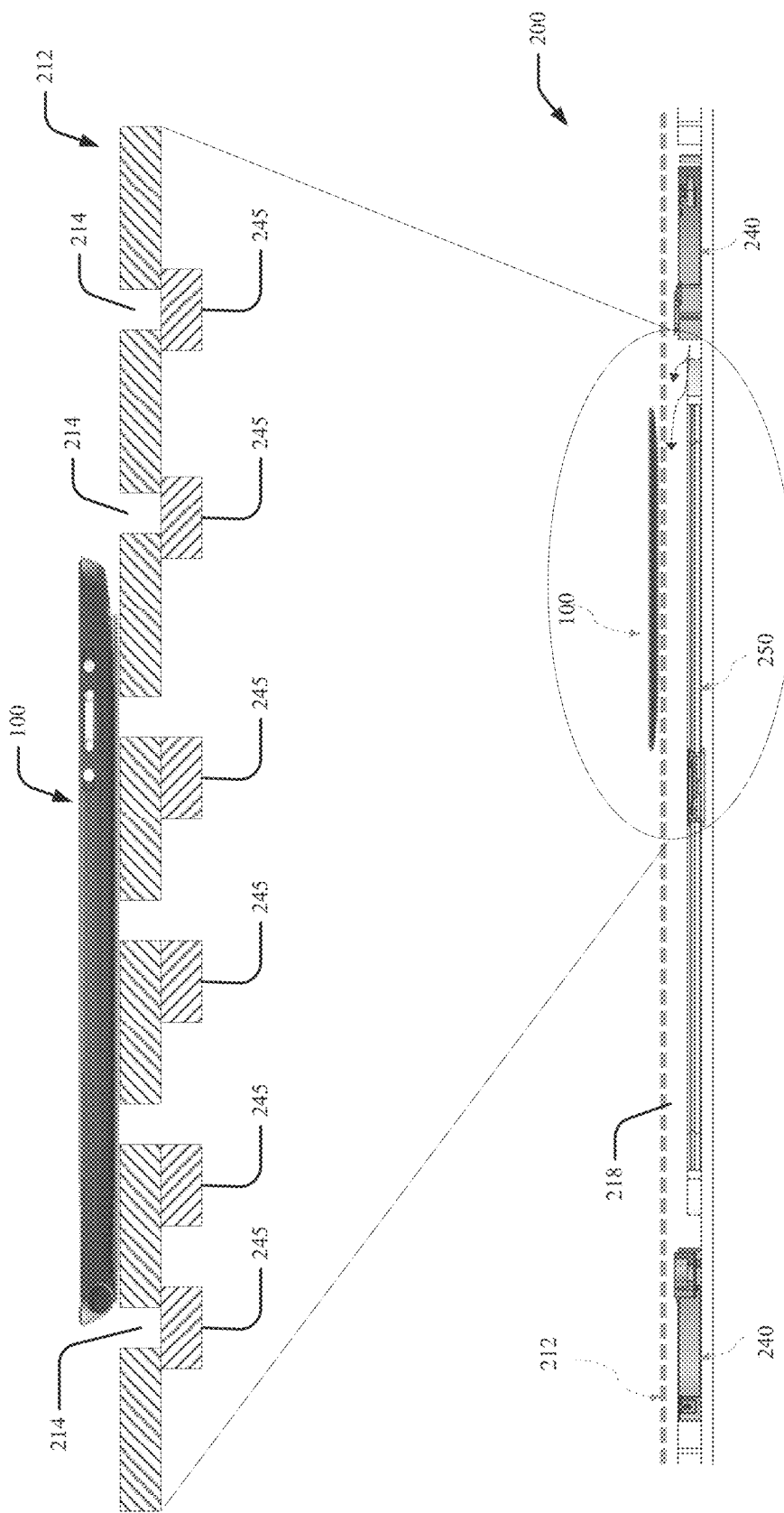
FIG. 4 is a schematic side view of a wireless docking mat in accordance with some examples.

Various components of a docking mat for an electronic device will be explained with reference to FIGS. 3D, 3E and FIG. 4. FIGS. 3D and 3E are schematic views of components of a wireless docking mat adapted for use with an electronic device in accordance with some examples. In the example depicted in FIG. 3D the first major surface 212 is removed to expose components of the docking mat 200. In the example depicted in FIG. 3E the first major surface 212 is depicted as translucent. FIG. 4 is a schematic side view of a wireless docking mat in accordance with some examples.

Referring to FIGS. 3D-3E and FIG. 4, in some examples a docking mat 200 for an electronic device 100 comprises at least one a wireless power transmitting device 250. In the example depicted in FIGS. 3D-3E the wireless power transmitting device 250 is implemented as an inductive charging coil. In other examples the wireless power transmitting device may be implemented as a capacitive coupling plate or using, e.g., Open Dots™ technology. Wireless power transmitting device 250 may be coupled to one or more power sources 260, as described above. In some examples the wireless power transmitting device 250 is positioned proximate the first major surface 212 of the docking mat 200.

In some examples the docking mat 200 comprises a plurality of surfaces including the first major surface 212 which define an internal chamber 218 through which air can flow (FIG. 4). Further, the body 210 comprises one or more vents 216 and the first major surface 212 comprises a plurality of apertures 214 through which air (or other gases) can pass. In such examples the docking mat may comprise a heat transfer system which comprises at least one blower 240 to force airflow through at least a portion of the plurality of apertures. In various embodiments, blower 240 may comprise a fan or blower arranged to create a side-in, side-out flow of air through the blower in a direction perpendicular to the axis of rotation of the blower. In various embodiments blower 240 may be powered by an AC motor, brushed DC motor or brushless DC motor.

In the example depicted in FIG. 3D-3E the docking mat comprises three blowers 240 which are configured to draw air from the vent(s) 216 into chamber 218 and to expel the air via the apertures 214 in first major surface 212. In other examples the airflow may be reversed such that the blower(s) 240 draw air through the apertures 214 in first major surface 212 and expel the air through one or more vents 216. Referring to FIG. 3E, in some examples the chamber 218 may be partitioned such that each blower 240 vents a separate portion of the chamber 218.

Referring to FIG. 4, in some examples a plurality of shutters 245 are positioned proximate the plurality of apertures 212 and are moveable between a first position in which the plurality of shutters 245 block the plurality of apertures 212 and a second position in which the plurality of shutters 245 do not block the plurality of apertures 212. By way of example, the individual shutters 245 may be coupled to an electromagnetic actuator which may be switched between a first state in which the shutter 245 is open and a second state in which the shutter 245 is closed.

Having described structural components of a docking mat, various operations of a docking mat will be described with reference to FIGS. 5A and 5B. In some examples one or more components of electronic device 100 cooperate with components of the docking mat 200 to facilitate wireless charging of electronic device 100. In further embodiments one or more components of electronic device 100 cooperate with components of the docking mat 200 to facilitate cooling of electronic device 100.

Figure 5A:
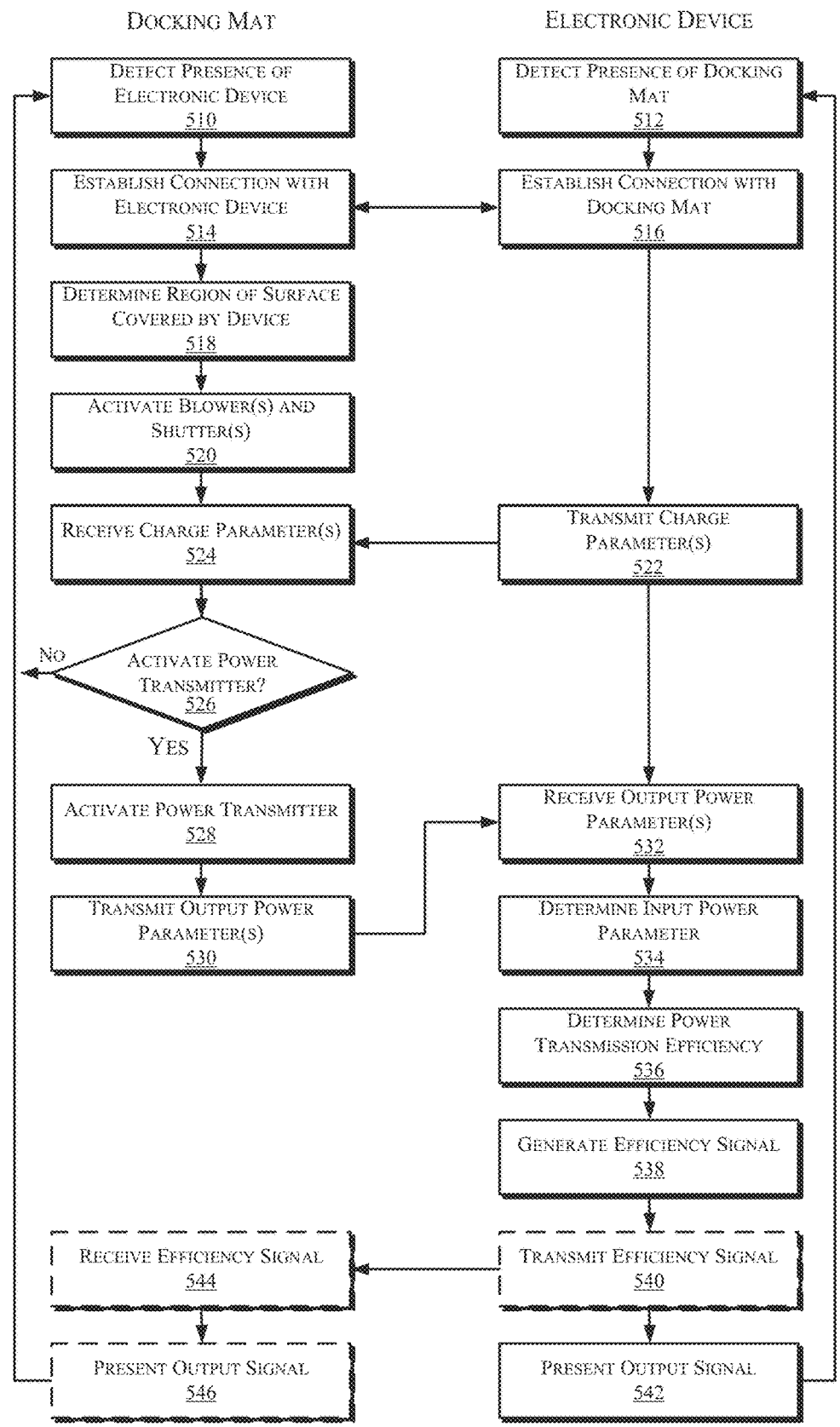
FIGS. 5A-5B are flowcharts illustrating operations in a method to operate a wireless docking mat in accordance with some examples.

Referring to FIG. 5A, at operation 510 one or more of the sensor(s) 215 in the wireless docking mat 200 detects the presence of an electronic device 100. Similarly, at operation 512 the electronic device 100 detects the presence of a docking mat 200.

At operation 514 the controller 220 in the docking mat 200 establishes a communication connection with the remote electronic device 100, and similarly at operation 516 the controller 176 in electronic device 100 establishes a communication connection with the controller 220 in the docking mat 200. The communication connection may be established via a wireless communication interface or by a wired interface.

At operation 518 the controller 220 in the docking mat 200 determines a region of the first major surface 212 of the docking mat 200 covered by the electronic device 100. In some examples the one or more sensors 215 may include pressure sensors positioned in various locations on the first major surface which generate an output in response to pressure applied to the first major surface 212. The controller may collect the output from the pressure sensors on an intermittent basis and may determine a region of the first major surface 212 of the docking mat 200 covered by the electronic device 100 by detecting an increase in the pressure on the surface of the mat in a region. In further examples the sensors 215 may include one or more optical sensors and/or magnetic sensors to determine a region of the first major surface 212 of the docking mat 200 covered by the electronic device 100.

At operation 520 the controller 220 activates one or more of the blowers 240 and the shutters 245 in the region of the first major surface 212 of the docking mat 200 covered by the electronic device 100. Activating the blower(s) 240 generates airflow into the chamber 218 and opening the shutter(s) 245 allows air to flow from the apertures 214 in the region of the first major surface 212 of the docking mat 200 covered by the electronic device 100. As described above, in some examples the first major surface 212 may comprise a surface pattern as illustrated in FIGS. 3A and 3B which provides a slight gap between portions of the first major surface 212 and the electronic device 100 to allow air flowing into or out of the apertures 214 to flow across the surface of the electronic device 100, thereby facilitating cooling of the electronic device 100.

In some examples the controller 220 utilizes the information acquired in operation 518 to open only a subset of the shutters in the region covered by the electronic device 100. By way of example, the information collected from the sensor(s) 215 which may be used to determine the region of the first major surface 212 may be used by the controller to selectively activate shutters 245 only in the region of the first major surface covered by the electronic device. In such examples each shutter 245 may be associated with a location identifier which identifies the location on the first major surface 212 of the docking mat 200 and the controller 220 may activate only those shutters 245 for which the location identifier corresponds to a region of the first major surface 212 covered by the electronic device 100.

At operation 522 the charge manager 176 of the electronic device 100 transmits one or more charge parameters to controller 220 of the docking mat. For example, the charge manager 176 may convey to the charge manager 176 a current charge state, a minimum charge threshold and a maximum charge threshold for the electronic device. The controller 220 receives the charge parameter(s) at operation 524 and at operation 526 the controller 526 determines whether to activate the wireless power transmitter 250. In some examples the controller 220 activates the wireless power transmitter 250 when the current charge state of the electronic device 100 is less than the maximum charge state and when the one or more sensors 215 indicate that the electronic device 100 is positioned on the surface 112 of the docking mat 200.

If, at operation 526 the controller 200 determines not to activate the wireless power transmitter 250 then control passes back to operation 510 and the controller 220 in the docking mat continues to monitor for the presence of additional electronic device(s) 100. By contrast, if at operation 526 the controller 220 determines to activate the wireless power transmitter 250 then control passes to operation 528 and the controller 220 activates the wireless power transmitter 250.

At operation 530 the controller 220 transmits one or more output power parameters for the wireless power transmitter 250. In operation, the power measurement unit 235 monitors the power output of the wireless charging device 250. In some examples at least one output power parameter represents the output power of the wireless power transmitter, e.g., x watts of power, which at operation is transmitted to the electronic device 100 via the communication connection established at operation 514.

In some examples the charge manager 176 of the electronic device 100 uses the output power parameter(s) to determine a power transmission efficiency parameter for power transmission between the wireless power transmitter 250 in the docking mat 200 and the wireless power receiver 138 in the electronic device 100. Thus, at operation 532 the charge manager 176 in the electronic device 100 receives the output power parameter(s) from the controller 220 in the docking mat 200.

At operation 534 the charge manager 176 determines one or more input power parameter(s) for the wireless power receiving device 138. In some examples at least one input power parameter represents the input power received at the wireless power receiving device 138 from the wireless power transmitter 250, e.g., y watts of power.

At operation 536 the charge manger 176 determines a power transmission efficiency. In some examples a power transmission efficiency parameter may be determined as the ratio of the input power received by the wireless power receiving device 138 to the output power generated by the wireless power transmitting device 250. At operation 538 the charge manager 176 generates an efficiency signal which represents the power transmission efficiency between the wireless power transmitting device 250 and the wireless receiving device 138.

Optionally, at operation 540 the charge manager 176 transmits the efficiency signal to the controller 220 on the docking mat 200. At operation 542 the charge manager presents an output signal based on the efficiency signal generated in operation 538. In one example the efficiency signal may be presented on one or more input/output interfaces 136, e.g., a display, of the electronic device 100. Control then passes back to operation 512.

In an example in which the charge manger 176 transmits the efficiency signal to the controller 220 on docking mat the controller 220 may receive the efficiency signal (operation 544) and similarly may present (operation 546) an output signal based on the efficiency signal generated in operation 538. In one example the efficiency signal may be presented (operation 546) on one or more input/output interfaces coupled to the docking mat 200. Control then passes back to operation 510.

Thus, the operations depicted in FIG. 5A enable a user of the electronic device enable the docking mat to cooperate with one or more electronic devices 200 to manage charging of the electronic device 100 and cooling of the electronic device 100. In response to the efficiency signals a user of the electronic device 100 may adjust the position of the electronic device 100 on the docking mat 200 in order to attempt to increase the efficiency of power transfer between the wireless power transmitting device 250 and the wireless receiving device 138.

In some examples controller 220 of the docking mat 200 determines a power transmission efficiency parameter for power transmission between the wireless power transmitter 250 in the docking mat 200 and the wireless power receiver 138 in the electronic device 100. Operations for such an example are depicted in FIG. 5B.

Figure 5B:
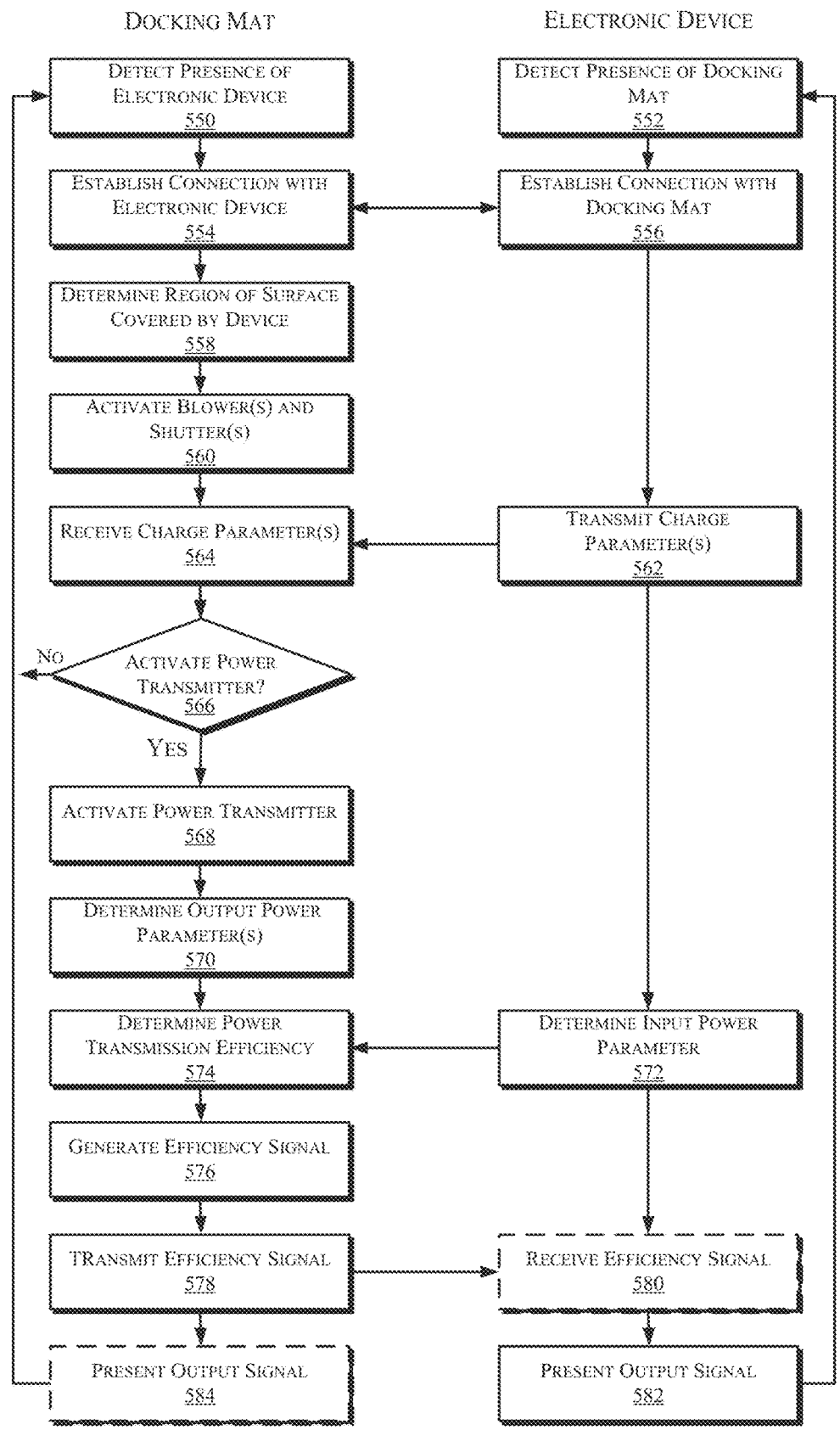

Referring to FIG. 5B, at operation 550 one or more of the sensor(s) 215 in the wireless docking mat 200 detects the presence of an electronic device 100. Similarly, at operation 552 the electronic device 100 detects the presence of a docking mat 200.

At operation 554 the controller 220 in the docking mat 200 establishes a communication connection with the remote electronic device 100, and similarly at operation 556 the controller 176 in electronic device 100 establishes a communication connection with the controller 220 in the docking mat 200. The communication connection may be established via a wireless communication interface or by a wired interface.

At operation 558 the controller 220 in the docking mat 200 determines a region of the first major surface 212 of the docking mat 200 covered by the electronic device 100. In some examples the one or more sensors 215 may include pressure sensors positioned in various locations on the first major surface which generate an output in response to pressure applied to the first major surface 212. The controller may collect the output from the pressure sensors on an intermittent basis and may determine a region of the first major surface 212 of the docking mat 200 covered by the electronic device 100 by detecting an increase in the pressure on the surface of the mat in a region. In further examples the sensors 215 may include one or more optical sensors and/or magnetic sensors to determine a region of the first major surface 212 of the docking mat 200 covered by the electronic device 100.

At operation 560 the controller activates one or more of the blowers 240 and the shutters 245 in the region of the first major surface 212 of the docking mat 200 covered by the electronic device 100. Activating the blower(s) 240 generates airflow into the chamber 218 and opening the shutter(s) 245 allows air to flow from the apertures 214 in the region of the first major surface 212 of the docking mat 200 covered by the electronic device 100. As described above, in some examples the first major surface 212 may comprise a surface pattern as illustrated in FIGS. 3A and 3B which provides a slight gap between portions of the first major surface 212 and the electronic device 100 to allow air flowing into or out of the apertures 214 to flow across the surface of the electronic device 100, thereby facilitating cooling of the electronic device 100.

At operation 562 the charge manager 176 of the electronic device 100 transmits one or more charge parameters to controller 220 of the docking mat. For example, the charge manager 176 may convey to the charge manager 176 a current charge state, a minimum charge threshold and a maximum charge threshold for the electronic device. The controller 220 receives the charge parameter(s) at operation 564 and at operation 566 the controller 526 determines whether to activate the wireless power transmitter 250. In some examples the controller 220 activates the wireless power transmitter 250 when the current charge state of the electronic device 100 is less than the maximum charge state and when the one or more sensors 215 indicate that the electronic device 100 is positioned on the surface 112 of the docking mat 200.

If, at operation 566 the controller 200 determines not to activate the wireless power transmitter 250 then control passes back to operation 550 and the controller 220 in the docking mat continues to monitor for the presence of additional electronic device(s) 100. By contrast, if at operation 566 the controller 220 determines to activate the wireless power transmitter 250 then control passes to operation 568 and the controller 220 activates the wireless power transmitter 250.

At operation 570 the controller 220 determines one or more output power parameters for the wireless power transmitter 250. In operation, the power measurement unit 235 monitors the power output of the wireless charging device 250. In some examples at least one output power parameter represents the output power of the wireless power transmitter, e.g., x watts of power, which at operation is transmitted to the electronic device 100 via the communication connection established at operation 554.

In some examples the controller 220 of the docking mat 200 uses the output power parameter(s) to determine a power transmission efficiency parameter for power transmission between the wireless power transmitter 250 in the docking mat 200 and the wireless power receiver 138 in the electronic device 100. Thus, at operation 572 the controller 200 in the docking mat 200 the charge manager 176 determines one or more input power parameter(s) for the wireless power receiving device 138. In some examples at least one input power parameter represents the input power received at the wireless power receiving device 138 from the wireless power transmitter 250, e.g., y watts of power. The input power parameter(s) may be transmitted to the controller 220, e.g., via the communication link established in operation 556.

At operation 574 the controller 200 determines a power transmission efficiency. In some examples a power transmission efficiency parameter may be determined as the ratio of the input power received by the wireless power receiving device 138 to the output power generated by the wireless power transmitting device 250. At operation 576 the controller 200 generates an efficiency signal which represents the power transmission efficiency between the wireless power transmitting device 250 and the wireless receiving device 138.

At operation 578 the controller 220 transmits the efficiency signal to the electronic device 100. At operation 580 the electronic device 100 receives the efficiency signal and at operation 582 the charge manager 176 presents an output signal based on the efficiency signal generated in operation 576. In one example the efficiency signal may be presented on one or more input/output interfaces 136, e.g., a display, of the electronic device 100. Control then passes back to operation 552.

In some examples the controller 220 on docking mat the controller 220 may present (operation 584) an output signal based on the efficiency signal generated in operation 576. In one example the efficiency signal may be presented (operation 584) on one or more input/output interfaces coupled to the docking mat 200. Control then passes back to operation 550.

Thus, the operations depicted in FIG. 5B also enable a user of the electronic device enable the docking mat to cooperate with one or more electronic devices 200 to manage charging of the electronic device 100 and cooling of the electronic device 100. In response to the efficiency signals a user of the electronic device 100 may adjust the position of the electronic device 100 on the docking mat 200 in order to attempt to increase the efficiency of power transfer between the wireless power transmitting device 250 and the wireless receiving device 138.

Figure 6:
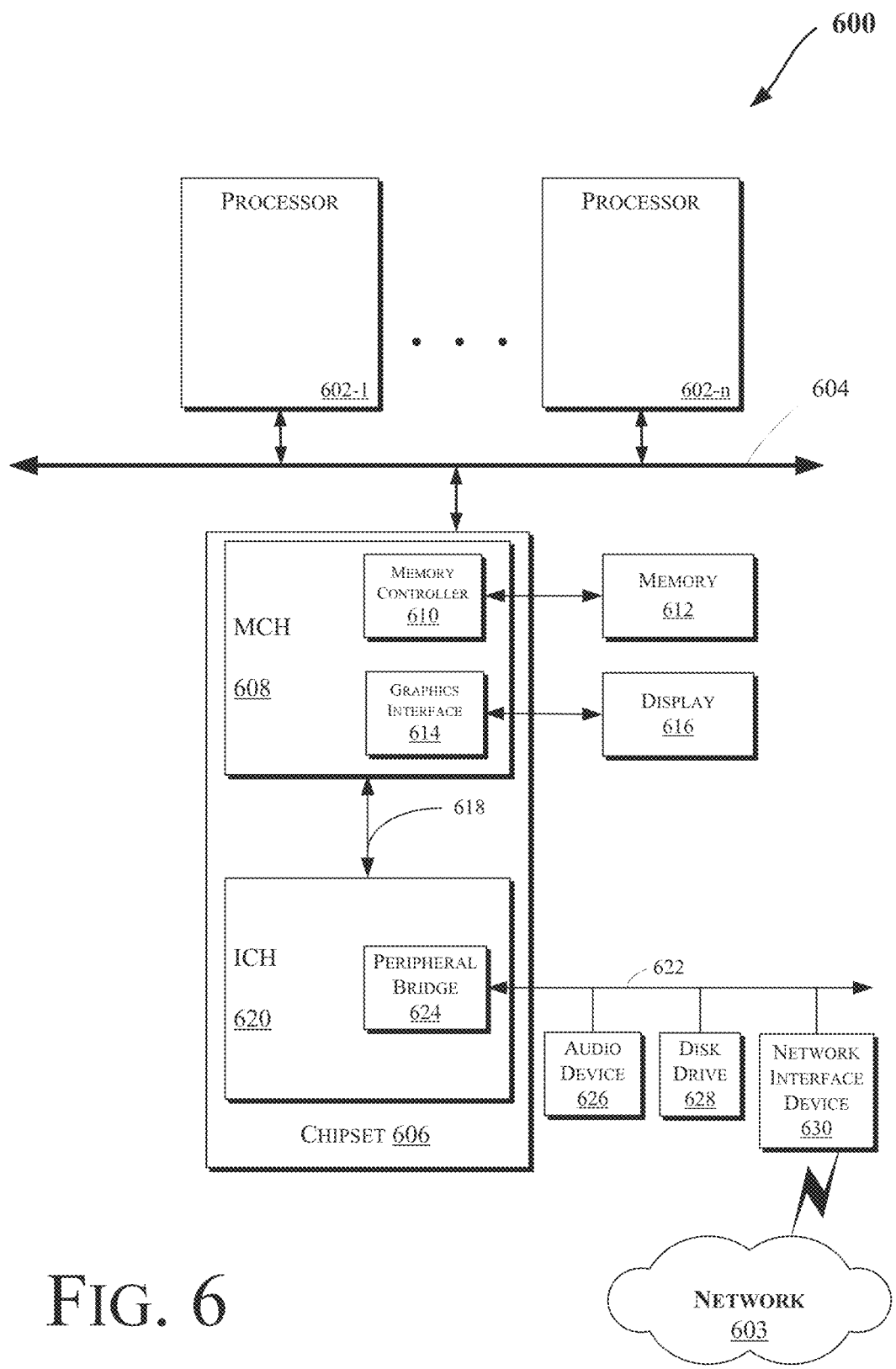
FIGS. 6-10 are schematic illustrations of electronic devices which may be adapted to mate with a wireless docking mat in accordance with some examples.

As described above, in some examples the electronic device may be embodied as an information processing system. FIG. 6 illustrates a block diagram of an information processing system 600 in accordance with an example. The information processing system 600 may include one or more central processing unit(s) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors.

A chipset 606 may also communicate with the interconnection network 604. The chipset 606 may include a memory control hub (MCH) 608. The MCH 608 may include a memory controller 610 that communicates with a memory 612. The memory 412 may store data, including sequences of instructions, that may be executed by the processor 602, or any other device included in the computing system 600. In one example, the memory 612 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 604, such as multiple processor(s) and/or multiple system memories.

The MCH 608 may also include a graphics interface 614 that communicates with a display device 616. In one example, the graphics interface 614 may communicate with the display device 616 via an accelerated graphics port (AGP). In an example, the display 616 (such as a flat panel display) may communicate with the graphics interface 614 through, for example, a signal converter that translates a digital representation of an image stored in a storage device such as video memory or system memory into display signals that are interpreted and displayed by the display 616. The display signals produced by the display device may pass through various control devices before being interpreted by and subsequently displayed on the display 616.

A hub interface 618 may allow the MCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the processor 602 and peripheral devices. Other types of topologies may be utilized. Also, multiple buses may communicate with the ICH 620, e.g., through multiple bridges or controllers. Moreover, other peripherals in communication with the ICH 620 may include, in various examples, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some examples. In addition, the processor 602 and one or more other components discussed herein may be combined to form a single chip (e.g., to provide a System on Chip (SOC)). Furthermore, the graphics accelerator 616 may be included within the MCH 608 in other examples.

Furthermore, the information processing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
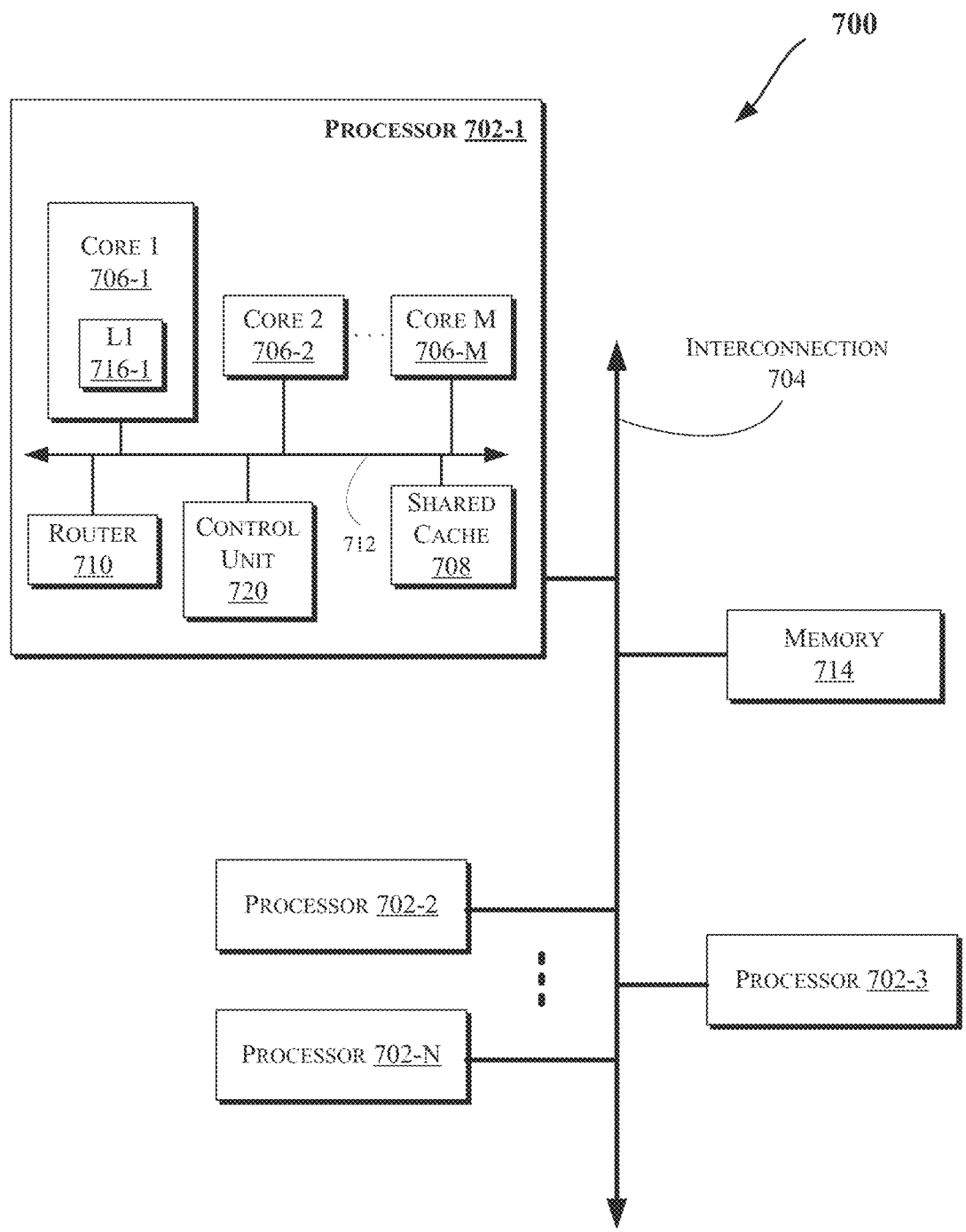

FIG. 7 illustrates a block diagram of an information processing system 700, according to an example. The information processing system 700 may include one or more processors 702-1 through 702-N (generally referred to herein as "processors 702" or "processor 702"). The processors 702 may communicate via an interconnection network or bus 704. Each processor may include various components some of which are only discussed with reference to processor 702-1 for clarity. Accordingly, each of the remaining processors 702-2 through 702-N may include the same or similar components discussed with reference to the processor 702-1.

In an example, the processor 702-1 may include one or more processor cores 706-1 through 706-M (referred to herein as "cores 706" or more generally as "core 706"), a shared cache 708, a router 710, and/or a processor control logic or unit 720. The processor cores 706 may be implemented on a single integrated circuit (IC) chip. Moreover, the chip may include one or more shared and/or private caches (such as cache 708), buses or interconnections (such as a bus or interconnection network 712), memory controllers, or other components.

In one example, the router 710 may be used to communicate between various components of the processor 702-1 and/or system 700. Moreover, the processor 702-1 may include more than one router 710. Furthermore, the multitude of routers 710 may be in communication to enable data routing between various components inside or outside of the processor 702-1.

The shared cache 708 may store data (e.g., including instructions) that are utilized by one or more components of the processor 702-1, such as the cores 706. For example, the shared cache 708 may locally cache data stored in a memory 714 for faster access by components of the processor 702. In an example, the cache 708 may include a mid-level cache (such as a level 2 (L2), a level 3 (L3), a level 4 (L4), or other levels of cache), a last level cache (LLC), and/or combinations thereof. Moreover, various components of the processor 702-1 may communicate with the shared cache 708 directly, through a bus (e.g., the bus 712), and/or a memory controller or hub. As shown in FIG. 7, in some examples, one or more of the cores 706 may include a level 1 (L1) cache 716-1 (generally referred to herein as "L1 cache 716").

Figure 8:
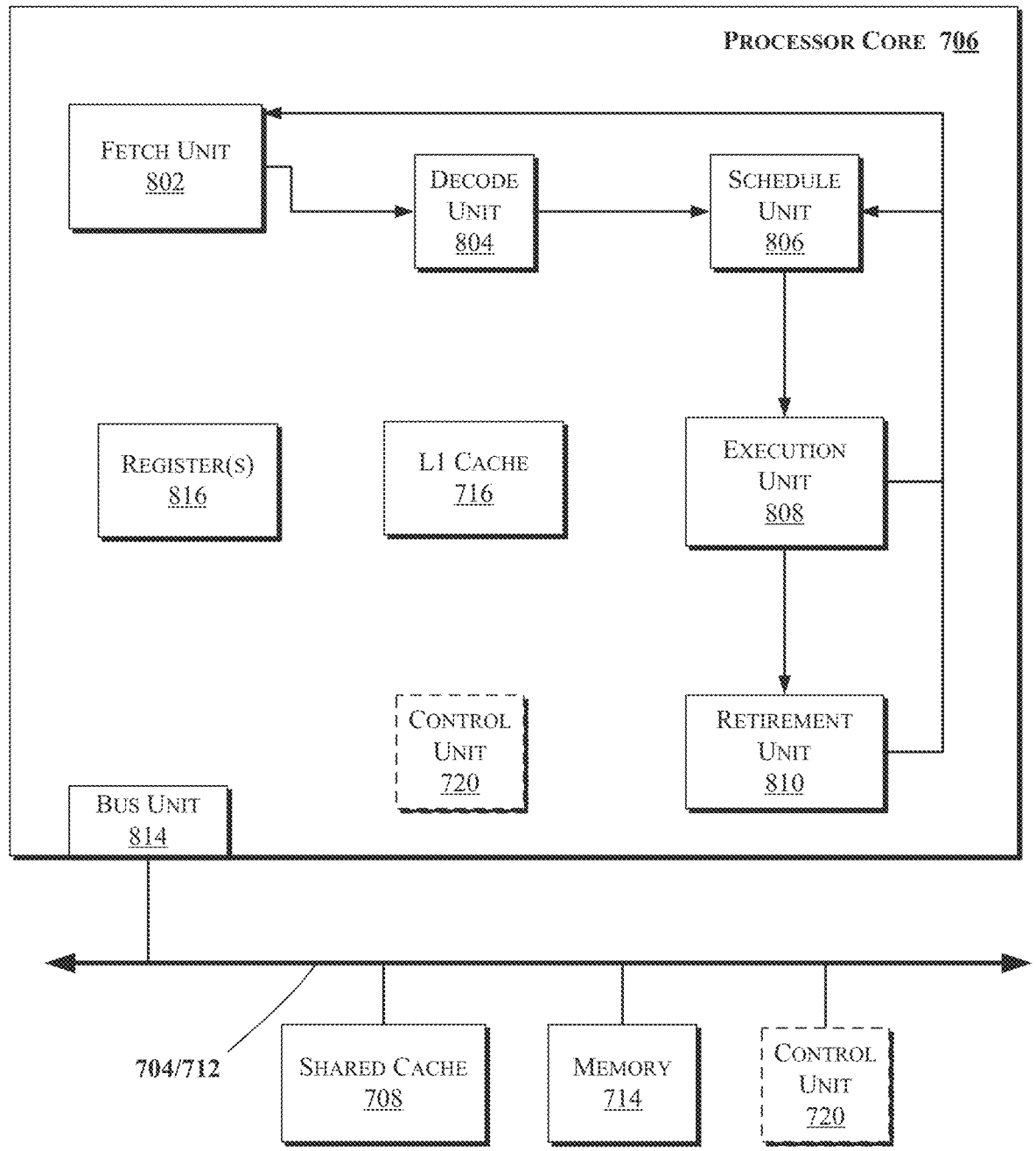

FIG. 8 illustrates a block diagram of portions of a processor core 706 and other components of an information processing system, according to an example. In one example, the arrows shown in FIG. 8 illustrate the flow direction of instructions through the core 706. One or more processor cores (such as the processor core 706) may be implemented on a single integrated circuit chip (or die) such as discussed with reference to FIG. 7. Moreover, the chip may include one or more shared and/or private caches (e.g., cache 708 of FIG. 7), interconnections (e.g., interconnections 704 and/or 112 of FIG. 7), control units, memory controllers, or other components.

As illustrated in FIG. 8, the processor core 706 may include a fetch unit 802 to fetch instructions (including instructions with conditional branches) for execution by the core 706. The instructions may be fetched from any storage devices such as the memory 714. The core 706 may also include a decode unit 804 to decode the fetched instruction. For instance, the decode unit 804 may decode the fetched instruction into a plurality of micro-operations.

Additionally, the core 706 may include a schedule unit 806. The schedule unit 806 may perform various operations associated with storing decoded instructions (e.g., received from the decode unit 804) until the instructions are ready for dispatch, e.g., until all source values of a decoded instruction become available. In one example, the schedule unit 806 may schedule and/or issue (or dispatch) decoded instructions to an execution unit 808 for execution. The execution unit 808 may execute the dispatched instructions after they are decoded (e.g., by the decode unit 804) and dispatched (e.g., by the schedule unit 806). In an example, the execution unit 808 may include more than one execution unit. The execution unit 808 may also perform various arithmetic operations such as addition, subtraction, multiplication, and/or division, and may include one or more an arithmetic logic units (ALUs). In an example, a co-processor (not shown) may perform various arithmetic operations in conjunction with the execution unit 808.

Further, the execution unit 808 may execute instructions out-of-order. Hence, the processor core 706 may be an out-of-order processor core in one example. The core 706 may also include a retirement unit 810. The retirement unit 810 may retire executed instructions after they are committed. In an example, retirement of the executed instructions may result in processor state being committed from the execution of the instructions, physical registers used by the instructions being de-allocated, etc.

The core 706 may also include a bus unit 714 to enable communication between components of the processor core 706 and other components (such as the components discussed with reference to FIG. 8) via one or more buses (e.g., buses 804 and/or 812). The core 706 may also include one or more registers 816 to store data accessed by various components of the core 706 (such as values related to power consumption state settings).

Furthermore, even though FIG. 7 illustrates the control unit 720 to be coupled to the core 706 via interconnect 812, in various examples the control unit 720 may be located elsewhere such as inside the core 706, coupled to the core via bus 704, etc.

Figure 9:
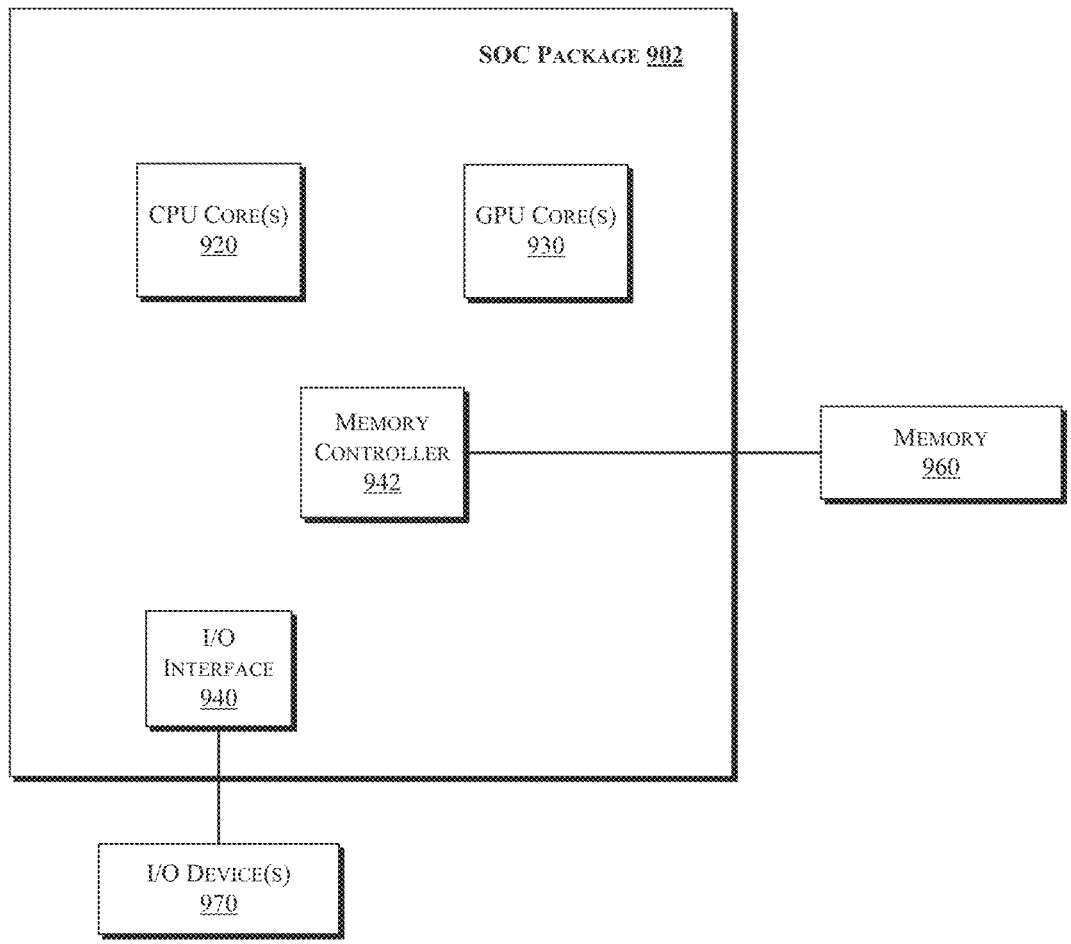

In some examples, one or more of the components discussed herein can be embodied as a System On Chip (SOC) device. FIG. 9 illustrates a block diagram of an SOC package in accordance with an example. As illustrated in FIG. 9, SOC 902 includes one or more processor cores 920, one or more graphics processor cores 930, an Input/Output (I/O) interface 940, and a memory controller 942. Various components of the SOC package 902 may be coupled to an interconnect or bus such as discussed herein with reference to the other figures. Also, the SOC package 902 may include more or less components, such as those discussed herein with reference to the other figures. Further, each component of the SOC package 902 may include one or more other components, e.g., as discussed with reference to the other figures herein. In one example, SOC package 902 (and its components) is provided on one or more Integrated Circuit (IC) die, e.g., which are packaged into a single semiconductor device.

As illustrated in FIG. 9, SOC package 902 is coupled to a memory 960 (which may be similar to or the same as memory discussed herein with reference to the other figures) via the memory controller 942. In an example, the memory 960 (or a portion of it) can be integrated on the SOC package 902.

The I/O interface 940 may be coupled to one or more I/O devices 970, e.g., via an interconnect and/or bus such as discussed herein with reference to other figures. I/O device(s) 970 may include one or more of a keyboard, a mouse, a touchpad, a display, an image/video capture device (such as a camera or camcorder/video recorder), a touch surface, a speaker, or the like.

Figure 10:
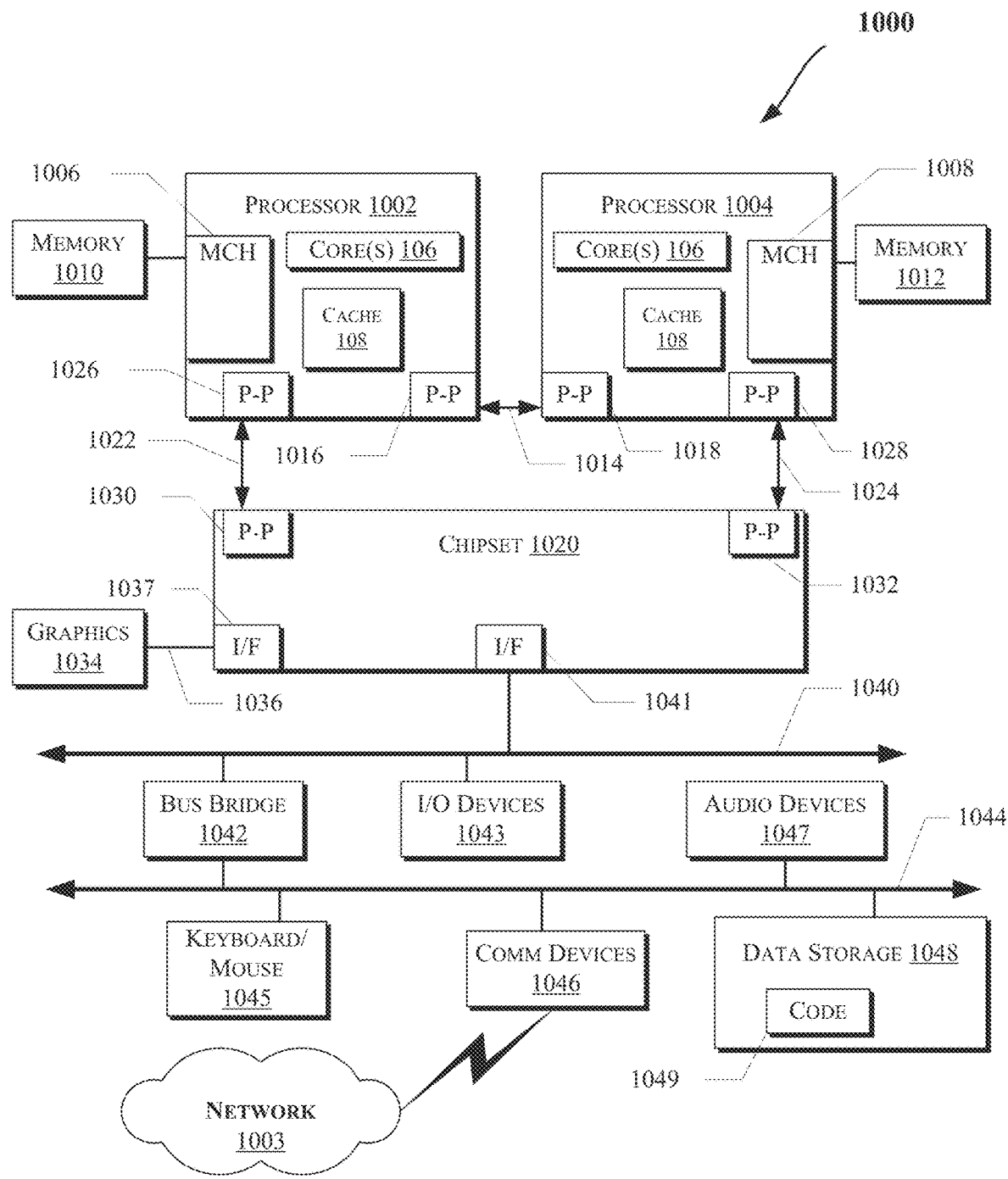

FIG. 10 illustrates an information processing system 1000 that is arranged in a point-to-point (PtP) configuration, according to an example. In particular, FIG. 10 shows a system where processors, memory, and input/output devices are interconnected by a number of point-to-point interfaces.

As illustrated in FIG. 10, the system 1000 may include several processors, of which only two, processors 1002 and 1004 are shown for clarity. The processors 1002 and 1004 may each include a local memory controller hub (MCH) 1006 and 1008 to enable communication with memories 1010 and 1012.

In an example, the processors 1002 and 1004 may be one of the processors 702 discussed with reference to FIG. 7. The processors 1002 and 1004 may exchange data via a point-to-point (PtP) interface 1014 using PtP interface circuits 1016 and 1018, respectively. Also, the processors 1002 and 1004 may each exchange data with a chipset 1020 via individual PtP interfaces 1022 and 1024 using point-to-point interface circuits 1026, 1028, 1030, and 1032. The chipset 1020 may further exchange data with a high-performance graphics circuit 1034 via a high-performance graphics interface 1036, e.g., using a PtP interface circuit 1037.

The chipset 1020 may communicate with a bus 1040 using a PtP interface circuit 1041. The bus 1040 may have one or more devices that communicate with it, such as a bus bridge 1042 and I/O devices 1043. Via a bus 1044, the bus bridge 1043 may communicate with other devices such as a keyboard/mouse 1045, communication devices 1046 (such as modems, network interface devices, or other communication devices that may communicate with the computer network 1003), audio I/O device, and/or a data storage device 1048. The data storage device 1048 (which may be a hard disk drive or a NAND flash based solid state drive) may store code 1049 that may be executed by the processors 1004.

The following pertains to further examples.

Example 1 is a docking mat for an electronic device, comprising a first major surface on which the electronic device may be positioned, a wireless power transmitting device, a controller comprising logic, at least partly including hardware logic, to, determine a location of the electronic device on the first major surface of the docking mat, establish a communication connection with the electronic device, receive at least one charge parameter from the electronic device; and activate the wireless power transmitting device in response to a determination that the electronic device is positioned proximate the wireless power transmitting device and the at least one charge parameter indicates that the electronic device is in a condition to receive power from the wireless power transmitting device.

In Example 2, the subject matter of Example 1 can optionally include an arrangement wherein further comprising one or more sensors to detect a position of the electronic device on the first major surface and an orientation of the electronic device on the first major surface.

In Example 3, the subject matter of any one of Examples 1-2 can optionally include an arrangement wherein the wireless power transmitting device comprises at least one of an inductive coil or a capacitive charge plate.

In Example 4, the subject matter of any one of Examples 1-3 can optionally include an arrangement wherein the wireless power transmitting device is positioned proximate the first major surface of the docking mat.

In Example 5, the subject matter of any one of Examples 1-4 can optionally include an arrangement wherein the controller further comprises logic, at least partially including hardware logic, to transmit an output power parameter for the wireless power transmitting device to the electronic device via the communication connection.

In Example 6, the subject matter of any one of Examples 1-5 can optionally include an arrangement receive an input power parameter from the electronic device; and determine a power transfer efficiency parameter from the output power parameter and the input power parameter; and present an output signal which varies as a function of the charging efficiency parameter.

In Example 7, the subject matter of any one of Examples 1-6 can optionally include an arrangement wherein the controller further comprises logic, at least partially including hardware logic, to receive a power transfer efficiency parameter from the electronic device; and present an output signal which varies as a function of the charging efficiency parameter.

In Example 8, the subject matter of any one of Examples 1-7 can optionally include a heat transfer system.

In Example 9, the subject matter of any one of Examples 1-8 can optionally include an arrangement wherein the docking mat comprises a plurality of surfaces including the first major surface which define an internal chamber; the first major surface comprises a plurality of apertures; and the heat transfer system comprises at least one blower to force airflow through at least a portion of the plurality of apertures.

In Example 10, the subject matter of any one of Examples 1-9 can optionally include logic, at least partially including hardware logic, to determine a region of the first major surface covered by the electronic device.

In Example 11, the subject matter of any one of Examples 1-10 can optionally include a plurality of shutters positioned proximate the plurality of apertures and moveable between a first position in which the plurality of shutters block the plurality of apertures and a second position in which the plurality of shutters do not block the plurality of apertures.

In Example 12, the subject matter of any one of Examples 1-11 can optionally include an arrangement wherein the controller further comprises logic, at least partially including hardware logic, to selectively open a subset of the plurality of shutters in the region of the first major surface covered by the electronic device Example 13 is a controller comprising logic, at least partly including hardware logic, to determine a location of the electronic device on a first major surface of a docking mat; establish a communication connection with the electronic device; receive at least one charge parameter from the electronic device; and activate a wireless power transmitting device of the docking mat in response to a determination that the electronic device is positioned proximate the wireless power transmitting device and the at least one charge parameter indicates that the electronic device is in a condition to receive power from the wireless power transmitting device.

In Example 14, the subject matter of Example 13 can optionally include logic, at least partly including hardware logic, to transmit an output power parameter for the wireless power transmitting device to the electronic device via the communication connection.

In Example 15, the subject matter of any one of Examples 12-13 can optionally include logic, at least partly including hardware logic, to receive an input power parameter from the electronic device; determine a power transfer efficiency parameter from the output power parameter and the input power parameter; and present an output signal which varies as a function of the charging efficiency parameter.

In Example 16, the subject matter of any one of Examples 13-15 can optionally include logic, at least partially including hardware logic, to receive an input power parameter from the electronic device, determine a power transfer efficiency parameter from the output power parameter and the input power parameter; and present an output signal which varies as a function of the charging efficiency parameter.

Example 17 is an electronic device, comprising a wireless power receiving device; at least one sensor to detect a remote wireless power transmitting device; and a first controller comprising logic, at least partly including hardware logic, to: establish a communication connection with a second controller communicatively coupled to the remote wireless power transmitting device; receive a power output parameter for the wireless power transmitting device; determine an input power parameter at the wireless power receiving device; determine a power transfer efficiency parameter from the power output parameter and the power input parameter; and present an output signal which varies as a function of the charging efficiency parameter.

In Example 18, the subject matter of Example 17 can optionally include an arrangement wherein the first controller comprises logic, at least partially including hardware logic, to forward the power transfer efficiency parameter to the second controller communicatively coupled to the wireless power transmitting device.

In Example 19, the subject matter of any one of Examples 17-18 can optionally include an arrangement wherein the wireless power receiving device is positioned proximate a surface of the electronic device.

Example 20 is a first controller comprising logic, at least partly including hardware logic, to establish a communication connection with a second controller communicatively coupled to the remote wireless power transmitting device; receive a power output parameter for the wireless power transmitting device; determine an input power parameter at the wireless power receiving device; determine a power transfer efficiency parameter from the power output parameter and the power input parameter; and present an output signal which varies as a function of the charging efficiency parameter.

In Example 21, the subject matter of Example 20 can optionally include logic, at least partially including hardware logic, to forward the power transfer efficiency parameter to the second controller communicatively coupled to the wireless power transmitting device.

The terms "logic instructions" as referred to herein relates to expressions which may be understood by one or more machines for performing one or more logical operations. For example, logic instructions may comprise instructions which are interpretable by a processor compiler for executing one or more operations on one or more data objects. However, this is merely an example of machine-readable instructions and examples are not limited in this respect.

The terms "computer readable medium" as referred to herein relates to media capable of maintaining expressions which are perceivable by one or more machines. For example, a computer readable medium may comprise one or more storage devices for storing computer readable instructions or data. Such storage devices may comprise storage media such as, for example, optical, magnetic or semiconductor storage media. However, this is merely an example of a computer readable medium and examples are not limited in this respect.

The term "logic" as referred to herein relates to structure for performing one or more logical operations. For example, logic may comprise circuitry which provides one or more output signals based upon one or more input signals. Such circuitry may comprise a finite state machine which receives a digital input and provides a digital output, or circuitry which provides one or more analog output signals in response to one or more analog input signals. Such circuitry may be provided in an application specific integrated circuit (ASIC) or field programmable gate array (FPGA). Also, logic may comprise machine-readable instructions stored in a memory in combination with processing circuitry to execute such machine-readable instructions. However, these are merely examples of structures which may provide logic and examples are not limited in this respect.

Some of the methods described herein may be embodied as logic instructions on a computer-readable medium. When executed on a processor, the logic instructions cause a processor to be programmed as a special-purpose machine that implements the described methods. The processor, when configured by the logic instructions to execute the methods described herein, constitutes structure for performing the described methods. Alternatively, the methods described herein may be reduced to logic on, e.g., a field programmable gate array (FPGA), an application specific integrated circuit (ASIC) or the like.

In the description and claims, the terms coupled and connected, along with their derivatives, may be used. In particular examples, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Reference in the specification to "one example" or "some examples" means that a particular feature, structure, or characteristic described in connection with the example is included in at least an implementation. The appearances of the phrase "in one example" in various places in the specification may or may not be all referring to the same example.

Although examples have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A docking mat for an electronic device, comprising:
   a first major surface on which the electronic device may be positioned;
   a wireless power transmitting device;
   a controller comprising logic, at least partly including hardware logic, to:
   determine a location of the electronic device on the first major surface of the docking mat;
   establish a communication connection with the electronic device;
   receive at least one charge parameter from the electronic device; and
   activate the wireless power transmitting device in response to a determination that the electronic device is positioned proximate the wireless power transmitting device and the at least one charge parameter indicates that the electronic device is in a condition to receive power from the wireless power transmitting device;
   transmit an output power parameter for the wireless power transmitting device to the electronic device via the communication connection;
   receive an input power parameter from the electronic device;
   determine a power transfer efficiency parameter from the output power parameter and the input power parameter; and
   present an output signal which varies as a function of the charging efficiency parameter.

2. The docking mat of claim 1, wherein further comprising one or more sensors to detect a position of the electronic device on the first major surface and an orientation of the electronic device on the first major surface.

3. The docking mat of claim 1, wherein the wireless power transmitting device comprises at least one of an inductive coil or a capacitive charge plate.

4. The docking mat of claim 1, wherein the wireless power transmitting device is positioned proximate the first major surface of the docking mat.

5. The docking mat of claim 1, wherein the controller further comprises logic, at least partially including hardware logic, to:
   receive a power transfer efficiency parameter from the electronic device; and
   present an output signal which varies as a function of the charging efficiency parameter.

6. The docking mat of claim 1, further comprising a heat transfer system.

7. The docking mat of claim 6, wherein:
   the docking mat comprises a plurality of surfaces including the first major surface which define an internal chamber;
   the first major surface comprises a plurality of apertures; and
   the heat transfer system comprises at least one blower to force airflow through at least a portion of the plurality of apertures.

8. The docking mat of claim 7, wherein the controller further comprises logic, at least partially including hardware logic, to:
   determine a region of the first major surface covered by the electronic device.

9. The docking mat of claim 8, further comprising:
   a plurality of shutters positioned proximate the plurality of apertures and moveable between a first position in which the plurality of shutters block the plurality of apertures and a second position in which the plurality of shutters do not block the plurality of apertures.

10. The docking mat of claim 9, wherein the controller further comprises logic, at least partially including hardware logic, to:
    selectively open a subset of the plurality of shutters in the region of the first major surface covered by the electronic device.

11. A controller comprising logic, at least partly including hardware logic, to:
    determine a location of the electronic device on a first major surface of a docking mat;
    establish a communication connection with the electronic device;
    receive at least one charge parameter from the electronic device; and
    activate a wireless power transmitting device of the docking mat in response to a determination that the electronic device is positioned proximate the wireless power transmitting device and the at least one charge parameter indicates that the electronic device is in a condition to receive power from the wireless power transmitting device;

transmit an output power parameter for the wireless power transmitting device to the electronic device via the communication connection;

receive an input power parameter from the electronic device;

determine a power transfer efficiency parameter from the output power parameter and the input power parameter; and present an output signal which varies as a function of the charging efficiency parameter.

12. The controller of claim 11, wherein the controller further comprises logic, at least partially including hardware logic, to:

receive a power transfer efficiency parameter from the electronic device; and present an output signal which varies as a function of the charging efficiency parameter.

13. An electronic device, comprising:

a wireless power receiving device;

at least one sensor to detect a remote wireless power transmitting device; and a first controller comprising logic, at least partly including hardware logic, to:

establish a communication connection with a second controller communicatively coupled to the remote wireless power transmitting device;

receive a power output parameter for the wireless power transmitting device;

determine an input power parameter at the wireless power receiving device;

determine a power transfer efficiency parameter from the power output parameter and the power input parameter; and present an output signal which varies as a function of the charging efficiency parameter.

14. The electronic device of claim 13, wherein the first controller comprises logic, at least partially including hardware logic, to:

forward the power transfer efficiency parameter to the second controller communicatively coupled to the wireless power transmitting device.

15. The electronic device of claim 13, wherein the wireless power receiving device is positioned proximate a surface of the electronic device.

16. A first controller comprising logic, at least partly including hardware logic, to:

establish a communication connection with a second controller communicatively coupled to the remote wireless power transmitting device;

receive a power output parameter for the wireless power transmitting device;

determine an input power parameter at the wireless power receiving device;

determine a power transfer efficiency parameter from the power output parameter and the power input parameter; and present an output signal which varies as a function of the charging efficiency parameter.

17. The first controller of claim 16, further comprising logic, at least partially including hardware logic, to:

forward the power transfer efficiency parameter to the second controller communicatively coupled to the wireless power transmitting device.

* * * * *